United States Patent [19]

Van Laarhoven et al.

[11] Patent Number: 5,001,079
[45] Date of Patent: Mar. 19, 1991

[54] METHOD OF MANUFACTURING A SEMICONDUCTOR DEVICE BY FORMING INSULATING SIDE WALLS WITH VOIDS BELOW OVERHANGS

[76] Inventors: Josephus M. F. G. Van Laarhoven; Wilhelmus F. M. Gootzen, both of Groenewoudseweg 1, Eindhoven, Netherlands; Michael F. B. Bellersen, Reemstückenkamp 3c, Hamburg, Fed. Rep. of Germany, 2000; Trung T. Doan, 1574 Shenandoah Dr., Boise, Id. 83712

[21] Appl. No.: 368,751

[22] Filed: Jun. 20, 1989

[30] Foreign Application Priority Data

Jun. 29, 1988 [GB] United Kingdom ............... 8815442

[51] Int. Cl.⁵ .................... H01L 21/441; H01L 21/76
[52] U.S. Cl. .................................. 437/50; 437/73; 437/194; 437/927; 357/65
[58] Field of Search ............... 437/50, 73, 194, 927

[56] References Cited

U.S. PATENT DOCUMENTS 4,755,477 7/1988 Chao .................................... 437/73

FOREIGN PATENT DOCUMENTS 63-179548A 7/1988 Japan .................................. 437/927

OTHER PUBLICATIONS

De Le Moneda, "Processes to Reduce and Control the P-Type Doping Conc. at..." *IBM Technical Disclosure Bulletin*, vol. 25, No. 11B, Apr. 1983, pp. 6131-6142.

*Primary Examiner*—Brian E. Hearn
*Assistant Examiner*—Laura M. Holtzman

[57] ABSTRACT

Spaced-apart regions (2) each having top (2a) and side walls (2b) meeting at an edge (20) are defined on a surface (1a) of a substructure (1) forming part of the device. A layer (3) of insulating material is provided over the surface (1a) and regions (2), so that the insulating material is provided preferentially at the edges (20) of the regions (2) to form adjacent the edges (20) portions (31) of the insulating material which overhang the underlying insulating material (32) provided on the surface (1a) and define a void therein. The insulating material layer (3) is then etched anisotropically to expose the top walls (2a). During the anisotropic etching the overhanging portions (31) initially mask the underlying insulating material provided on the surface (1a) so that the etching of the underlying insulating material is controlled by the etching away of the overhanging portions (31) and when the top walls (2a) are exposed relatively gently sloping spacers or portions (30) of the insulating material remain on the side walls (2b). A further insulating material layer (4) may then be provided over the structure.

12 Claims, 3 Drawing Sheets

METHOD OF MANUFACTURING A SEMICONDUCTOR DEVICE BY FORMING INSULATING SIDE WALLS WITH VOIDS BELOW OVERHANGS

This invention relates to a method of manufacturing a semiconductor device, which method comprises defining on a surface of a substructure (forming part of the device) spaced-apart regions each having top and side walls meeting at an edge, providing a layer of insulating material over the said surface and regions and etching the insulating material layer anisotropically to expose the top walls of the regions, thereby leaving portions of the insulating material on the side walls of the regions.

BACKGROUND OF THE INVENTION

Such a method is described in, for example, U.S. Pat. No. 4,641,420 and Japanese Patent application JP-A-60124951. As described in Japanese Patent application JP-A-60124951, the spaced-apart regions are electrically conductive regions formimg part of a metallisation level and, after anisotropic etching of the insulating material to leave portions or spacers of the insulating material on the side walls of the electrically conductive regions, a further insulating layer is provided over the electrically conductive regions to protect the electrically conductive regions from corrosion and/or oxidation. In contrast, U.S. Pat. No. 4,641,420 describes a method of contacting an underlying region such as a doped zone adjacent a surface of a semiconductor body by opening a via through insulating material provided over the surface of the semiconductor body so that the via forms the spaced-apart regions between which the surface of the doped zone is exposed. A layer of insulating material provided over the spaced-apart regions is etched anisotropically to leave portions or spacers of the insulating material on the side walls of the spaced-apart regions. An electrically conductive layer is then deposited to make electrical contact to the doped zone.

In both U.S. Pat. No. 4,641,420 and Japanese Patent application JP-A-60124951, the aim of providing the spacers or portions of insulating material on the side walls of the spaced-apart regions is to provide a more smooth surface, that is a surface with less steep side walls and sharp steps or corners, onto which a subsequent layer can be deposited so that the underlying surface structure does not cause undesired weaknesses or breaks in the subsequent layer. However, the surface provided by the spacers or portions of the insulating material remaining on the side walls of regions can be quite steep and indeed near the intersection of a spacer with the surface the surface provided by the spacer can be almost perpendicular to the surface of the substructure. Although the use of the methods described above enables satisfactory coverage by the further layer when the spacing between the regions is relatively large in comparison to the thickness of the regions, where the spacing of the regions is comparable to the thickness of the regions (that is the height of the side walls) then problems with coverage by the subsequent layer may occur because of, for example, the relatively steep surface provided by the spacers at the intersection with the surface of the substrate.

It is an object of the present invention to provide a method of manufacturing a semiconductor device which aims at enabling spacers or portions of insulating material to be provided on the side walls so that the surface provided by the spacers has a relatively more gentle slope so that the steps and edges over which a subsequent layer is to be provided are relatively less steep and sharp.

SUMMARY OF THE INVENTION

According to the present invention, a method of manufacturing a semiconductor device, which method comprises defining on a surface of a substructure forming part of the device spaced-apart regions, each having top and side walls meeting at an edge, providing a layer of insulating material over the surface and regions and etching the insulating material layer anisotropically to expose the top walls of the regions, thereby leaving portions of the insulating material on the side walls of the regions, is characterised by causing the insulating material to be provided preferentially at the edges of the regions to form adjacent edge portions of the insulating material which overhang the underlying insulating material provided on the surface so that, during the anisotropic etching of the insulating material, the underlying insulating material provided on the surface is initially masked by the overhanging portions.

Thus, using a method embodying the invention, the overhanging portions of the insulating material initially mask the underlying insulating material during the anisotropic etching. The overhanging portions are themselves etched by the anisotropic etching and as the etching proceeds and the overhanging portions are etched and so become smaller, the area of the insulating material on the surface exposed to the anisotropic etching increases. The anisotropic etching of the insulating material beneath the overhanging portions is thus controlled by the etching away of the overhanging portions and the inventors have found that this results in the spacers or portions of the insulating material remaining on the side walls of the regions having more gently sloping surfaces than conventional spacers so that the steps and edges are relatively less steep and sharp thereby enabling, for example, a relatively thick, greater than one nanometer, further layer of insulating material to be provided over the regions reducing the possibility of voids being formed in the further insulating layer between the regions which voids could otherwise result in weaknesses in the further insulating layer and could detrimentally affect the electrical properties of the device.

The insulating material layer may be provided to a thickness sufficient for the overhanging portions on adjacent regions to join one another to define a void in the insulating material layer beneath the joining overhanging portions. Although it is not necessary for the overhanging portions join, more gently sloping spacers or portions may be provided on the side walls if the overhanging portions do join together because the entire surface of the insulating material layer between spaced-apart regions will then be initially masked during the anisotropic etching.

The insulating material layer may be caused to be provided preferentially at the edges of the regions by using a technique for providing the insulating material layer which deliberately results in a very bad step coverage. However, in the interests of reproducibility it is preferred that the insulating material be caused to be provided preferentially on the edges by defining the regions so that there is an acute angle where the top and side walls meet.

The desired acute angles may be provided by defining the regions so that each region is formed by a relatively thick subsidiary region which defines the side wall and a relatively thin capping subsidiary region which provides the top wall and projects beyond the side wall so as to provide the acute angle where the top and the side walls meet. The relatively thin capping subsidiary region may be provided by defining the regions by providing a relatively thick layer of one material on the surface, providing a relatively thin layer of a different material on the relatively thick layer and etching the relatively thick and thin layers through masking means so that the relatively thin layer is underetched to define the relatively thin capping subsidiary regions and the relatively thick layer defines the relatively thick subsidiary regions. The relatively thick subsidiary regions may be electrically conductive regions, for example formed of aluminium, while the relatively thin subsidiary regions, which are preferrably less than 50 nanometers thick, may be provided of any suitable material, for example by oxidising or anodising the relatively thick subsidiary regions where the relatively thick subsidiary regions are formed of aluminium or by providing a relatively thin layer of a material such as aluminium silicide, titanium, tungsten, titanium-tungsten alloy, titanium silicide or amorphous silicon on the relatively thick layer.

The acute angle defined by the relatively thin capping layer which projects beyond the side walls may provide a structural or geometric feature which facilitates formation of the overhanging portions. In a preferred embodiment where the insulating material layer, for example formed of silicon oxide, silicon nitride or silicon oxynitride, is deposited by plasma enhanced chemical vapor deposition, it is believed that the strong electric field which arises at the acute angle defined by the relatively thin capping layer leads to a high rate of deposition of the insulating material at the edges of the regions, so ensuring formation of the overhanging portions.

It should be understood that, as is known in the art, a silicon oxide layer deposited by plasma enhanced chemical vapour deposition may be mainly silicon dioxide but will contain silicon, oxygen and hydrogen.

BRIEF DESCRIPTION OF THE DRAWINGS

Embodiments of the invention will be now be described, by way of example, with reference to the accompanying drawings, in which.

Figure 1:
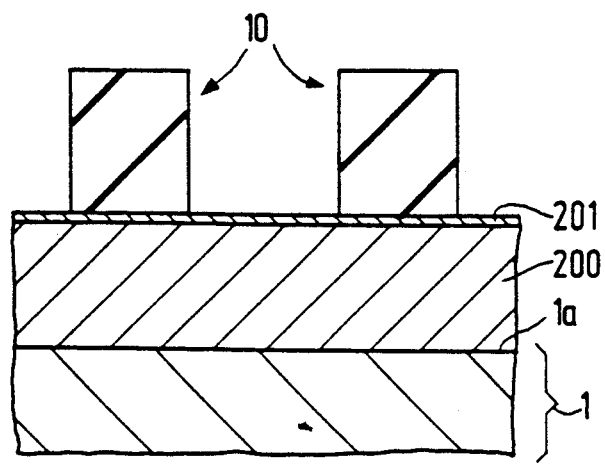
FIGS. 1, 2, 3, 4, 5 and 6 are cross-sectional views of part of a semiconductor body for illustrating a method embodying the invention.

It should be understood that the Figures are merely schematic and are not drawn to scale. In particular, certain dimensions such as the thickness of layers of regions may have been exaggerated while other dimensions may have been reduced.

DESCRIPTION OF THE INVENTION

Referring now to the drawings, and especially FIGS. 1 to 6, a method of manufacturing a semiconductor device comprises defining on a surface 1a of a substructure 1 forming part of the device spaced-apart regions 2 each having top 2a and side 2b walls meeting at an edge 20, providing a layer 3 of insulating material over the surface 1a and the regions 2 and etching the insulating material layer 3 anisotropically to expose the top surface 2a of the regions 2 thereby leaving portions 30 of the insulating material on the side walls 2b of the regions 2. In accordance with the invention, the insulating material layer 3 is caused to be provided preferentially at the edges 20 of the regions 2 to form adjacent the edges 20 portions 31 of the insulating material which overhang the underlying insulating material 32 provided on the surface 1a so that during the anisotropic etching of the insulating material the underlying insulating material 32 provided on the surface is initially masked by the overhanging portions 31.

A method embodying the invention will now be described in greater detail with reference to FIGS. 1 to 7. In the example to be described, the regions 2 are electrically conductive regions and constitute one level of metallisation of a semiconductor device such as an integrated circuit, one particular example of which will be described below with reference to FIG. 7.

Figure 7:
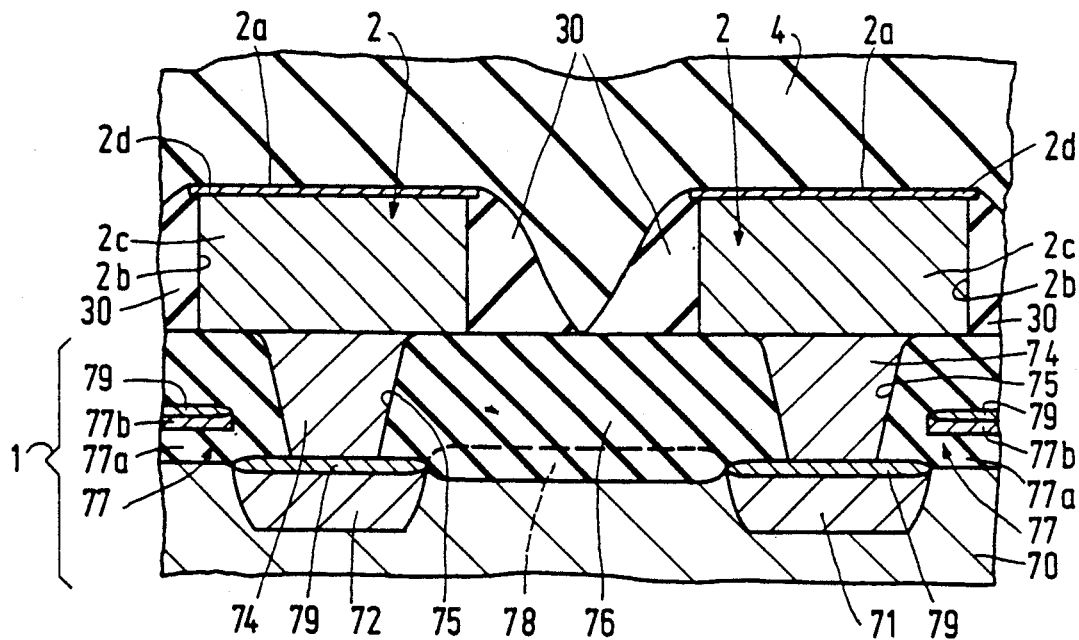
FIG. 7 is a cross-sectional view of part of a semiconductor device manufactured using a method in accordance with the invention.

In the example shown in FIG. 7, the substructure 1 comprises a monocrystalline silicon semiconductor substrate or body 70 having doped zones of different conductivities and conductivity types which are formed in a known manner, for example by dopant implantation and/or diffusion, to provide circuit elements of a silicon integrated circuit. Two doped zones 71, 72 are shown in FIG. 7, each doped zone being connected to a respective electrically conductive region 2 of the metallisation level by means of an electrically conductive plug 74 which extends through a via 75 formed in an insulating layer 76 covering the doped zones. In the examples shown in FIG. 7, each of the doped zones 71, 72 forms a pn junction with the substrate 70 and constitutes a source or drain zone of an MOS transistor having an insulated gate 77. The MOS transistors are separated by field oxide 78 which forms part of the insulating layer 76. In order to reduce contact resistance, a metal silicide layer 79, for example a titanium silicide layer, may be provided on the doped zones 71, 72 and the conductive layer for example a doped polycrystalline silicon layer, of the insulated gate. It will, of course, be appreciated that the integrated circuit will comprise many such MOS transistors (MOSTs) and/or other circuit elements and that, although not shown in FIG. 7, electrical connection will be made to the insulated gates in a manner similar to that used to contact the doped zones 71, 72.

Referring now to FIGS. 1 to 6, the electrically insulating regions 3 are provided on the substructure 1 (for example to contact the doped zones 71, 72 by means of the electrically conductive plugs 74 where the substructure 1 has the structure shown in FIG. 7), by first providing, as shown in FIG. 1, a relatively thick layer 200, of, in this example, aluminium on the surface 1a of the substructure. The aluminium may be provided using any suitable conventional technique, for example by chemical vapour deposition or by sputtering. Where the dimensions of the integrated circuit are of the order of a micrometer or even submicron, the layer 200 may have a thickness of about 1.5 to 3 micrometers.

After the relatively thick layer 200 has been provided on the surface 1a, a relatively thin layer 201 is provided on the relatively thick layer 200. In the interests of clarity the relatively thin layer is shown considerably thicker than in actual fact, particularly in FIGS. 1 to 4 and 6, 7. The relatively thin layer 201 may be an electrically conductive layer such as a layer of alumimium silicide or of titanium, tungsten, a titanium-tungsten alloy or possibly molybdenum, cobalt, chromium, hafnium or alloys or silicides of any of the above, which is provided on the relatively thick layer 200 using conventional techniques, for example by sputter deposition. The relatively thin layer 201 need not necessarily be an electrically conductive layer but could be an insulating layer such as silicon dioxide, silicon nitride or silicon oxynitride deposited by, for example, plasma enhanced chemical vapour deposition. Also, amorphous silicon could be used to form the relatively thin layer 201. As a further alternative, a thin insulating layer of aluminium oxide ($Al_2O_3$) could be provided as the layer 201 by subjecting the relatively thick aluminium layer 200 to a conventional oxidation or anodising treatment or by sputter depositing the aluminium oxide onto the relatively thick aluminium layer 200. The relatively thin layer 201 has a thickness which is preferably in the range of from about 10 nanometers to about 200 nanometers, typically about 50 nanometers.

Once the relatively thin layer 201 has been provided, a masking layer is provided on the relatively thin layer 201 and patterned using conventional techniques to define a mask 10 through which the relatively thick and thin layers 200 and 201 are to be etched to form the electrically conductive regions 2. In this example the mask 10 is provided by providing a photosensitive resist layer on the surface of the relatively thin layer 201 and patterning the photosensitive resist layer using conventional photolithographic and etching techniques.

Once the mask 10 has been defined as shown in FIG. 1, the relatively thick and thin layers 200 and 201 are etched anisotropically through the mask 10 using an appropriate anisotropic etchant. Where the relatively thick layer 200 is an aluminium layer and the relatively thin layer 201 is a layer of aluminium silicide or aluminium oxide, then a chlorine-containing plasma such as boron trichloride ($BCl_3$) or trichloromethane ($CHCl_3$) in an argon carrier gas may be used as the anisotropic etchant. Where the relatively thin layer is a layer of titanium, tungsten or a titanium-tungsten alloy, then a fluorine-containing plasma such as $CF_4$ or $SF_4$ in an argon carrier gas may be used as the anisotropic etchant. The anisotropic etching is monitored by conventional means, that is by monitoring the constituents of the plasma, and is stopped when the surface 1a of the substrate between the electrically conductive regions being defined is exposed.

The electrically conductive regions 2 are thus defined so that each region 2 comprises a relatively thick subsidiary region 2c of aluminium defining the side walls 2b and a relatively thin capping subsidiary region 2d defining the top surface 2a of the region. As indicated very schematically in the Figures, the anisotropic etching results in a slight underetching of the relatively thin capping subsidiary region 2d so that the relatively thin capping subsidiary region 2d projects beyond the side walls 2b. As will be appreciated by those skilled in the art, although the slight underetching of the relatively thin capping subsidiary region 2d has been illustrated in the Figures by showing the capping subsidiary regions 2d as projecting beyond effectively straight side walls 2b, the underetching will normally be somewhat more localised to an area of the side walls 2b just beneath each capping subsidiary region 2d so effectively providing a recess in the side walls 2b immediately beneath the capping subsidiary region 2d. A short isotropic etch may be carried out after the anisotropic etching, to ensure that the capping subsidiary regions are underetched. Such a short isotropic etch may be carried out using the same plasma by altering the bias potential as is well known in the art, or may be carried out using, for example, phosphoric acid as the isotropic etchant.

The etching of the relatively thick and thin layers 200 and 201 to form the electrically conductive regions thus results in there being an acute angle at the edge 20 between the top surface 2a and side walls 2b of each electrically conductive region 2, the acute angle being provided in this example by the fact that the relatively thin capping region 2d projects beyond the side walls 2b, and, being thin, provides a very sharp, almost pointlike corner or projection at the edge 20.

After formation of the electrically conductive regions 2, the insulating material layer 3 is provided to cover the electrically conductive regions 2 and the surface 1a. In this example, the insulating material layer is provided as a layer of silicon oxide, although other suitable insulating materials such as silicon nitride or silicon oxynitride could be used. The insulating material layer 3 is provided using a plasma enhanced chemical vapour deposition technique in a conventional plasma enhanced chemical vapour reactor such as the ND 6200 reactor produced by Electrotech. As indicated above, as is known in the art, a silicon oxide layer deposited by plasma enhanced chemical vapour deposition will normally be mostly silicon dioxide but will contain silion, oxygen and hydrogen.

Figure 2:
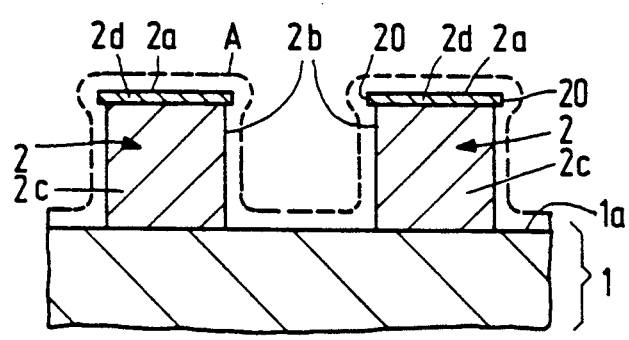

The fact that the capping subsidiary regions 2d project beyond the side walls 2b of the electrically conductive regions 2 to provide an acute angle or sharp edge 20 causes preferential deposition of the insulating material, for example silicon oxide, adjacent the sharp edges 20 of each electrically conductive region 2 so that as the insulating material is deposited, a portion 31 of the insulating material adjacent each sharp edge 20 begins to bulge outwardly and so starts to overhang the underlying insulating material 32 being provided on the substrate surface 1a adjacent the electrically conductive regions 2. The dashed line A in FIG. 2 illustrates a stage during the deposition of the insulating material layer 3 to show how the insulating material is deposited preferentially adjacent the sharp edges 20. It is believed that the main reason that such preferential deposition occurs is because of the strong electric field which arises at the sharp edge 20 during tha plasma enhanced chemical vapour deposition, however, geometrical effects may also be involved.

Although as described above, the sharp edges 20 are provided by the use of a thin capping subsidiary region 2d which projects beyond the side walls 2b, the sharp edges 20 may be provided in other ways. Thus, for example, it may be possible to form the sharp edges 20 by omitting the capping subsidiary region 2d and using an etching process which etches the layer 200 so that the side walls 2b are not approximately vertical but slant inwardly towards the surface 1a thereby forming an acute angle with the top surface 2a. Also, although in the arrangement described above a plasma enhanced chemical vapour deposition technique is used to provide the insulating material layer 3, it may be possible to achieve the formation of the overhanging portions 31 using techniques where, for example, the shape of the layer being deposited follows very closely the contours of the surface on which it is being deposited.

The formation of the insulating material layer 3 is continued until an appreciable overhanging portion 31 has been provided at each edge 20. In the example shown in FIG. 3, deposition of the insulating material layer 3 is continued until the overhanging portions 31 forming on adjacent edges 21 meet or join so that all of the insulating material formed on the surface 1a between adjacent electrically conductive regions 2 is covered by the adjoining overhanging portions 31. As illustrated clearly in FIG. 3, the adjoining overhanging portions 31 define with the underlying insulating material 32 provided on surface 1a a void 33 in the insulating material beneath the joining overhanging portions 31. To give an example, where the step coverage of the insulating material is such that the average thickness deposited on vertical surfaces such as the side walls 2b is about half that deposited on horizontal surfaces such as the top walls 2a, then for the overhanging portions 31 to join one another, if the electrically conductive regions are spaced-apart by, for example, about one micrometer then the insulating material layer 3 may be deposited to have a thickness on the top walls 2a and the surface 1a of about one micrometer, while if the electrically conductive regions 2 are spaced-apart by about two micrometers, then the insulating material layer 3 may be deposited to have, on the top walls 2a and the surface 1a, thickness of about two micrometers.

Although in the arrangement described above, the insulating material layer 3 is deposited to a thickness sufficient for adjacent overhanging portions 31 to join to form a void 33, this need not necessarily be the case. Rather, adjacent overhanging portions may be spaced-apart slightly so as to define a chamber with a narrow or restriced entrance or neck rather than a fully closed chamber or void 33.

Once the desired thickness of the insulating material layer 3 has been formed the anisotropic etching process is carried out. Any suitable anisotropic etching process, for example an anisotropic plasma etching process, may be used and it will, of course, be appreciated that the process to be used will depend on the nature of the material forming the insulating material layer 3. Where the insulating material layer 3 is, as in this example, formed of silicon oxide, then the anisotropic etching may be carried out using a fluorine-containing plasma such as carbon tetrafluoride ($CF_4$), $CHF_3$ or $C_xF_y$ (e.g. $C_2F_6$) in an inert carrier gas, for example argon gas. In this example, a combined carbon tetrafluoride and a $CHF_3$ plasma is used.

The progress of the anisotropic etching is monitored by conventional techniques, in this case by examining the spectrum of the constituents in the plasma, in particular the change in the carbon monoxide emission line (at 483 nm) of the spectrum and the etching will be stopped when the top walls 2a of the electrically conductive regions 2 are exposed.

Figure 3:
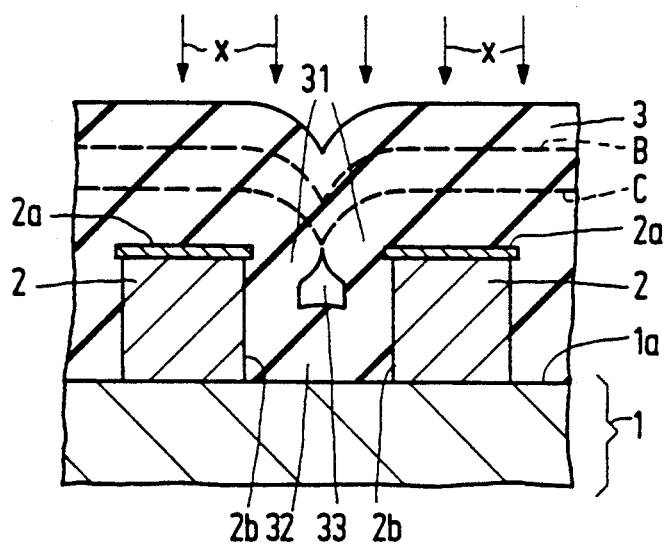
Figure 4:
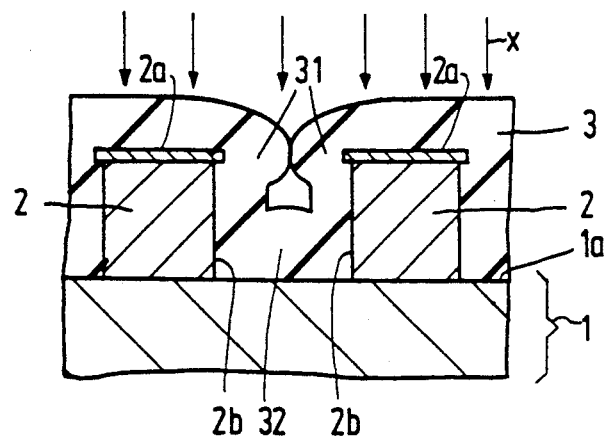
Figure 5:
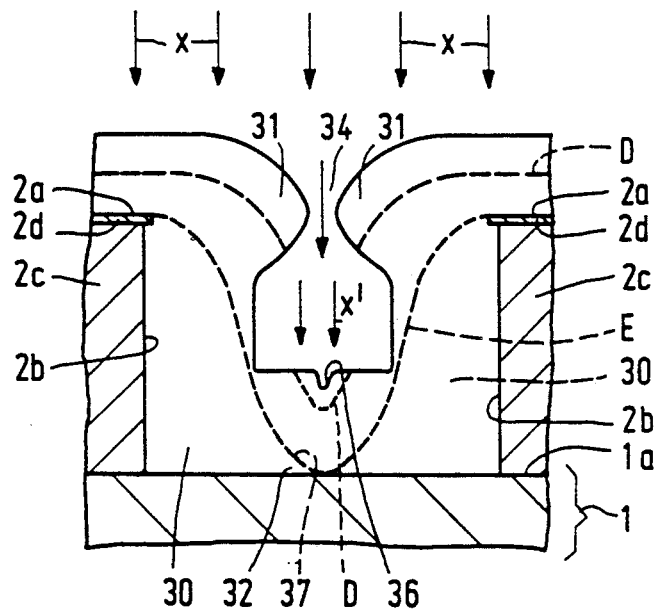

The progress of the anisotropic etching is illustrated in FIGS. 3, 4 and 5. Initially, as shown by the arrows X in FIG. 3, the insulating material layer 3 is etched anisotropically in a direction perpendicular to the surface 1a so that an even thickness of the insulating material layer 3 is removed across the entire layer. The dashed lines B and C indicate the position of the exposed surface of the insulating material of the layer 3 at two different times during the anisotropic etching. FIG. 4 shows more clearly the situation illustrated by the dashed line C in FIG. 3, that is the stage where a sufficient thickness of the insulating material layer 3 has been removed so that adjacent overhanging portions 31 are only just joined. Of course, if desired, the actual thickness of the insulating material layer may only be sufficient to produce the structure shown in FIG. 4, in which case FIG. 4 will, of course, resemble the situation at the commencement of the anisotropic etching, although the thickness of the part 32 of the insulating material layer 3 on the surface 1a would, of course, be less than shown in FIG. 4.

As the anisotropic etching proceeds from the situation shown in FIG. 4, a gap 34 appears between the overhanging portions 31 as shown in FIG. 5. Of course, as indicated above, the insulating material layer 3 may have a thickness such that there is a small gap, similar to the gap 34, between the overhanging portions at the start of the anisotropic etching.

The presence of the gap 34 exposes to the anisotropic etching, as indicated schematically by the arrow X' in FIG. 5, the insulating material lying directly beneath the gap 34. In fact FIG. 5 shows the situation a short time after the opening of the gap 34 by the anisotropic etching and thus shows that a small groove 36 has already been etched in the insulating material lying directly beneath the gap 34. As the anisotropic etching proceeds further, the gap 34 becomes larger and so the area of the insulating material directly beneath the gap 34 which is exposed to the anisotropic etching increases with the size of the gap 34.

The dashed line D in FIG. 5 illustrates the approximate situation where the gap 34 has been enlarged somewhat while the dashed line E illustrates the approximate situation when the top surface 2a of the electrically conductive regions 2 have been exposed and the anisotropic etching has been stopped. In practice, there will normally be a slight overetching, so that the anisotropic etching is continued slightly after the top surfaces 2a of the electrically conductive regions 2 have been exposed, so that the portions or spacers 30 of the insulating material remaining on the side walls 2b have a shape similar to that indicated schematically by the dashed line E in FIG. 5. The effect of the masking of the underlying parts of the insulating material 32 by the overhanging portions 31 is two-fold. Thus, during the initial stages of the anisotropic etching the underlying insulating material 32 remains masked from the anisotropic etchant by the overhanging portions 31. However, once the gap 34 is opened, anisotropic etching of the underlying insulating material 32 commences and the area of the parts 32 exposed to the anisotropic etching increases as the gap 34 between the overhanging portions 31 enlarges. These two effects combine to provide relatively gently sloping surfaces 37 for the portions or spacers 30 remaining on the side walls 2b of the electrically conductive regions 2, particularly where the portions or spacers 30 intersect or meet the surface 1a. Depending upon the separation of the electrically conductive regions 2 and the degree of overetching, the portions 30 remaining on adjacent side walls 2b may even meet at the surface 1a. Even where the portions 30 do not meet at the surface 1a, the gently sloping surfaces 37 provided using a method embodying the invention means that the angle between the gently sloping surfaces 32 and the surface 1a should be less than 90° and there are no sharp corners or angles at the interfaces between the portions 30 and the surface 1a.

Figure 6:
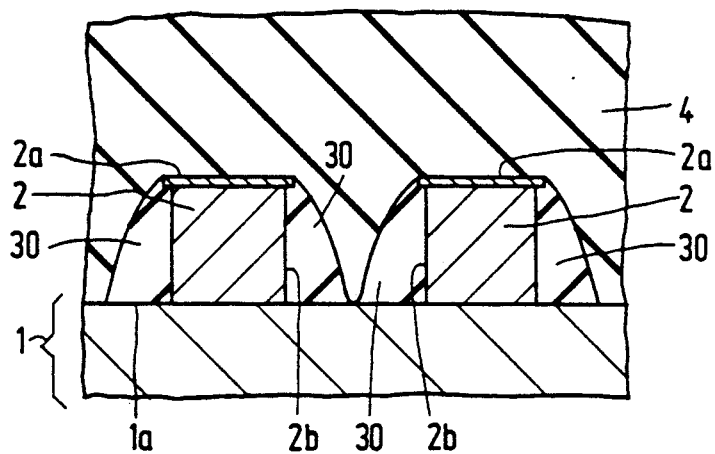

As shown in FIG. 6, after the portions or spacers 30 have been formed, a further insulating layer 4 is, in this example, provided over the electrically conductive regions 2. The further insulating layer 4 may be deposited using any suitable conventional deposition technique and in this case a plasma enhanced chemical vapour deposition technique is used. The further insulating layer 4 may be a layer of silicon oxide, or a layer of silicon nitride or a layer of silicon oxynitride. In this example the further insulating layer 4 is a layer of silicon nitride.

The use of a method in accordance with the invention to provide the portions or spacers 30 which have relatively gently sloping surfaces 37 provides a relatively smooth surface onto which the further insulating material layer 4 is to be deposited so that the occurrence of sharp steps or steep edges at which bad coverage by the further insulating material layer 4 may have occurred is avoided or at least reduced, thereby preventing or at least lessening the possibility of voids (which would result in weak areas in the further insulating material layer and could result in a bad electrical performance) being formed in the further insulating material layer 4. Using a method in accordance with the invention, the further insulating material layer 4 may be provided up to thicknesses of one micrometer or greater to form the final passivation or insulating layer of an integrated circuit device without, or with much reduced, risk of the occurrence of voids which would otherwise detrimentally affect the performance of the device.

FIG. 7, as mentioned above, is a schematic cross-sectional view illustrating part of a monocrystalline silicon semiconductor body 70 of a semiconductor device, for example an integrated circuit such as a CMOS integrated circuit, in which a final passivation layer 4 is provided using a method in accordance with the invention as discussed above with reference to FIGS. 1 to 6.

The doped zones 71, 72 of the structure shown in FIG. 7 are provided adjacent a surface 70a of the semiconductor 70 using conventional techniques, and the associated insulated gates 77 are provided by formation in a conventional manner of a thin gate insulating layer 77a, deposition of a doped polycrystalline silicon layer 77b and then patterning using conventional photolithographic and etching techniques.

The field oxide 78 (indicated in part by a dashed line in FIG. 7) is formed by local oxidation of silicon (LOCOS) in a known manner to define the areas of the MOSTs.

In order to provide lower contact resistance to subsequent metallisation, titanium is sputter-deposited over the surface 70a and the body 70 is then heated rapidly to form the titanium silicide contact layer 79 at the exposed silicon surface areas, that is on the doped regions 71, 72 and on the doped polycrystalline silicon gate layers 77b. The remaining titanium on the insulating material may be removed by etching in a solution of, for example, hydrogen peroxide and ammonium hydroxide in water.

The insulating layer 76 is then deposited by chemical vapour deposition onto the surface. Using conventional photolithographic and etching techniques the vias 75 are opened through the insulating layer 76 and the conductive plugs 74 provided in the vias 75 to enable connection to subsequent metallisation.

The conductive plugs 74 may be formed by first depositing an adhesion layer (not shown) onto the insulating layer 76 and into the vias 75 to improve the adhesion to the insulating material of a subsequently-deposited tungsten layer. The adhesion layer may be, for example, titanium or titanium-tungsten and may be sputter-deposited as is known in the art. After deposition of the tungsten, for example by chemical vapour deposition, the deposited material is etched back, for example using an $SF_6$ plasma etching step, to expose the surface of the insulating layer 76 leaving the plugs 74 of tungsten within the vias. In this example, the above described structure thus forms the substructure 1 onto which the relatively thick and thin layers 100 and 200 are provided and then patterned as described above with reference to FIGS. 1 and 2 to form the electrically conductive regions 2 which contact, by means of the plugs 74, the underlying doped zones 71, 72. The method then proceeds as described above with reference to FIGS. 1 to 5 to form the gently sloping portions or spacers 30 and the further insulating layer 4 is then provided as described with reference to FIG. 6. The further insulating layer 4 may be the final passivating layer of the device as described above or may be an intermediate insulating layer provided between metallisation levels, so that, in the latter case, the spacers 30 act to enable a flatter or more planar insulating layer to be provided on top of the, for example, first metallisation layer enabling better coverage by a subsequent metallisation layer.

Figure 8:
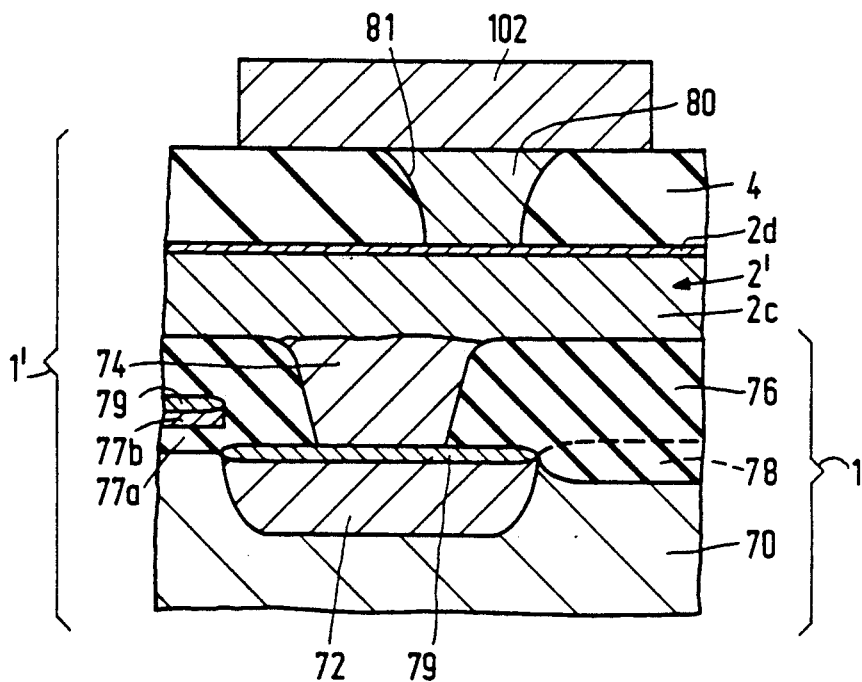
FIG. 8 is a cross-sectional view taken perpendicularly to the cross-section shown in FIG. 7 of part of a semiconductor device similar to that shown in FIG. 7 and manufactured using a method in accordance with the invention.

FIG. 8 is a cross-sectional view of part of a semiconductor device similar to that shown in FIG. 7 but taken in a direction perpendicular to that of the cross-section shown in FIG. 7, that is, in a direction perpendicular to the plane of the paper.

As will be understood from a comparison of FIGS. 7 and 8, in the device illustrated in FIG. 8 the electrically conductive regions 2' shown is a strip-like region which would in FIG. 7 extend into the plane of the paper. As shown in FIG. 8, in order to enable contact to the electrically conductive regions 2' a via 80 is opened through the further insulating layer 4 and filled by a conductive plug 81 in a similar manner to that in which the conductive plugs 74 are formed. Further metallisation, again for example aluminium, is deposited and patterned using conventional techniques to define a further electrically conductive region 102 which makes electrical contact with the electrically conductive regions 2' via the conductive plug 80. The use of a method embodying the invention to form the gently sloping spacers or portions 30 shown in FIG. 7 enables the further insulating material 4 to have a relatively flat surface onto which the metallisation to form the further electrically conductive region 102 is provided. As will be appreciated from the above, the semiconductor device shown in FIG. 8 will normally consist of many MOSTS and there will normally be many further electrically conductive regions 102. Accordingly, a method embodying the invention can be used to provide a final passivating layer (not shown) over the further electrically conductive regions 102 as described above with reference to FIGS. 1 to 6 with the substructure 1 being replaced by the substructure 1' shown in FIG. 8. Also, the further layer 4 need not necesarily be an insulating layer but could be an electrically conductive layer, for example for making connection to insulated gates forming the regions 2 and/or doped regions or zones in the semiconductor body 70.

A method embodying the invention may be used to provide electrical connection to a substructure forming part of a semiconductor device which may, as described above, be an integrated circuit, semiconductor device or which may be a discrete semiconductor device, even a power semiconductor device.

From reading the present disclosure, other modifications will be apparent to persons skilled in the art. Such modifications may involve other features which are already known in the art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation or modification of one or more of those features, whether or not it relates to the same invention as presently claimed in any claim and whether or not it mitigates any or all of the same technical problems as does the present invention. The applicants hereby give notice that new claims may be formulated to such features and/or combination of such features during the prosecution of the present application or of any further application derived therefrom.

We claim:

1. A method of manufacturing a semiconductor device, which method comprises defining spaced-apart regions on a surface of a substructure forming part of the device, each of said regions having top and side walls meeting at an edge, providing a layer of insulating material over said surface and regions, and etching the insulating material layer anisotropically to expose the top walls of the regions, thereby leaving portions of insulating material on the side walls of the regions, characterized by causing the insulating material to be provided preferentially at said edges of the regions to form adjacent edge portions of the insulating material which overhang the underlying insulating material provided on said surface so that, during the anisotropic etching of the insulating material, the underlying insulating material provided on said surface is initially masked by the overhanging portions, and characterized by providing the insulating material layer to a thickness sufficient for the overhanging portions on adjacent regions to join one another to define a void in the insulating material layer beneath the joining overhanging portions.

2. A method according to claim 1, characterised by causing the insulating material to be preferentially provided on the said edges by defining the regions so that there is an acute angle where the top and side walls meet.

3. A method according to claim 2, characterised by defining the regions so that each region is formed by a relatively thick subsidiary region which defines the side wall and a relatively thin capping subsidiary region which provides the top wall and projects beyond the side wall so as to provide the acute angle where the top and side walls meet.

4. A method according to claim 3, characterised by defining the regions by providing a relatively thick layer of one material on the surface, providing a relatively thin layer of a different material on the relatively thick layer and etching the relatively thick and thin layers through masking means so that the relatively thin layer is underetched to define the relatively thin capping subsidiary regions and the relatively thick layer defines the relatively thick subsidiary regions.

5. A method according to claim 3, characterised by providing the relatively thick subsidiary regions of an electrically conductive material.

6. A method according to claim 5, characterised by providing the relatively thick subsidiary regions of aluminium.

7. A method according to claim 3, characterised by providing the relatively thin subsidiary regions of a material selected from the group consisting of aluminium silicide, aluminium oxide, titanium silicide, titanium, tungsten, and titanium-tungsten alloy.

8. A method according to claim 4, which comprises providing the relatively thick layer as a layer of aluminium and providing the relatively thin layer by oxidising or anodising the relatively thick layer.

9. A method according to claim 3, characterised by providing the relatively thin subsidiary regions so that the relatively thin subsidiary regions have a thickness less than about 50 nanometers.

10. A method according to claim 1, characterised by providing the first layer by plasma enhanced chemical vapour deposition.

11. A method according to one claim 1, characterised by providing the first layer as a layer of silicon dioxide, silicon nitride or silicon oxynitride.

12. A method according to claim 1, characterised by providing a further layer of insulating material over the substructure after the anisotropic etching.

* * * * *